United States Patent
Cheng et al.

(10) Patent No.: US 8,434,669 B1
(45) Date of Patent: May 7, 2013

(54) UNIVERSAL BOND HEAD FOR WIRE BONDERS

(75) Inventors: Chi Wah Cheng, New Territories (HK); Man Kit Mui, Kowloon (HK)

(73) Assignee: ASM Technology Singapore Pte Ltd., Singapore (SG)

( * ) Notice: Subject to any disclaimer, the term of this patent is extended or adjusted under 35 U.S.C. 154(b) by 0 days.

(21) Appl. No.: 13/344,172

(22) Filed: Jan. 5, 2012

(51) Int. Cl.
*B23K 31/02* (2006.01)

(52) U.S. Cl.
USPC .......................... 228/180.5; 228/4.5; 228/904

(58) Field of Classification Search ............... 228/180.5, 228/4.5, 904
See application file for complete search history.

(56) References Cited

U.S. PATENT DOCUMENTS 6,439,448 B1 * 8/2002 Ringler ...................... 228/110.1

* cited by examiner

*Primary Examiner* — Erin Saad
(74) *Attorney, Agent, or Firm* — Ostrolenk Faber LLP

(57) ABSTRACT

A wedge wire bonder comprises a wedge that is operative to oscillate along a transducer axis for bonding a wire onto a surface and a wire clamp comprising a pair of parallel clamping plates for clamping the wire. The clamping plates having clamping surfaces that are oriented substantially perpendicularly to the transducer axis. Lateral guides are arranged on opposite sides of the wire, such that the lateral guides and the wire are generally aligned parallel to the clamping surfaces of the clamping plates for guiding the wire towards the wedge.

8 Claims, 3 Drawing Sheets

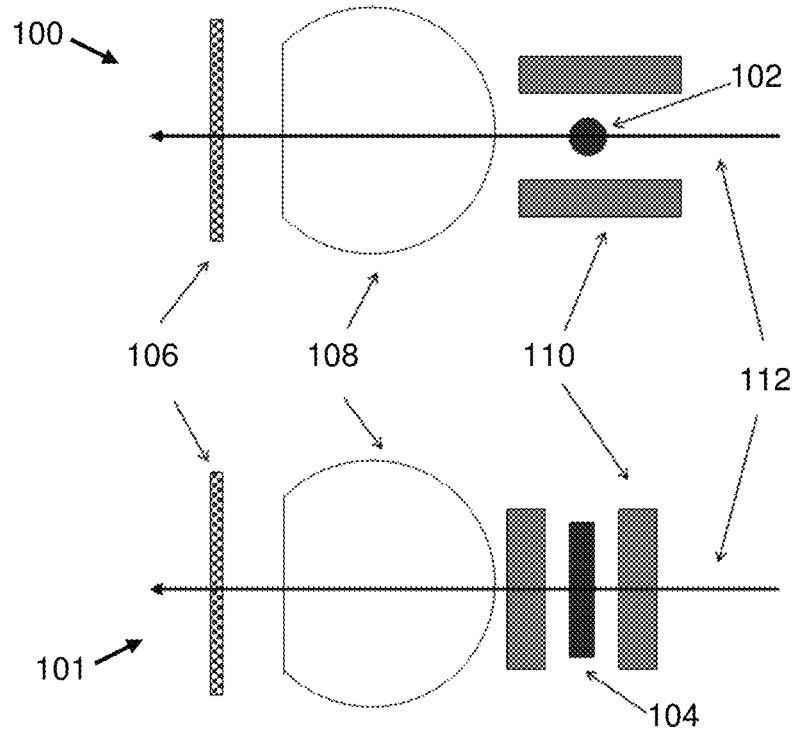
FIG. 1 (Prior Art)
FIG. 2 (Prior Art)
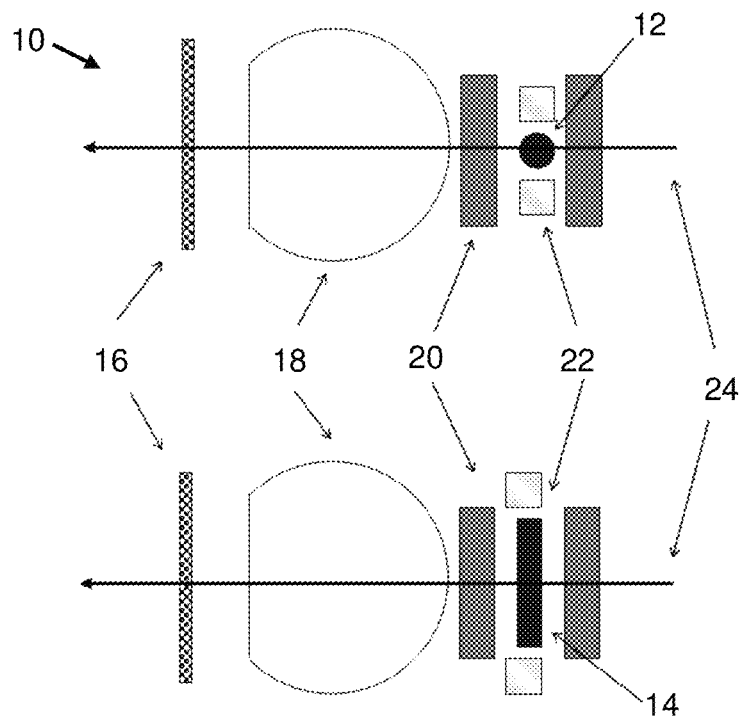
FIG. 3
FIG. 4

UNIVERSAL BOND HEAD FOR WIRE BONDERS

FIELD OF THE INVENTION

The invention relates to a wire bonding apparatus, and in particular to a wire bonding apparatus which is adapted for bonding different types of wires.

BACKGROUND AND PRIOR ART

Typically, relatively large and heavy wires such as aluminum wire are used in wedge wire bonding for high power electronic packages, which conduct larger currents in operation. A wedge wire bonding machine that is configured to bond such wires generally comprises a bond head that is able to position itself relative to the electronic packages in the X, Y, Z and theta axes for wedge wire bonding. Having a theta axis is necessary in wedge wire bonding for aligning an orientation of a wire bond with the wire being fed between a first bond and a second bond.

Heavy wire may commonly be produced in multiple forms, for example, they may have round cross-sections (hereinafter referred to as "round wires") or ribbon-shaped rectangular cross-sections (hereinafter referred to as "ribbon wires"). Conventionally, a bond head of the wire bonder is adapted to bond only one type of wire, such as either round wire or ribbon wire. Thus, when the bond head is adapted to bond round wire, the bond head module needs to be replaced to configure the wire bonding machine for bonding ribbon wire, as explained below.

In a typical heavy aluminum wire bonder, there are three major components at the vicinity of the bonding tip in order to perform wire bonding: a wire clamp module, a vibration-generating transducer with a wedge, and a cutter module. The transducer generates ultrasonic power and induces ultrasonic vibrations of the wedge to bond the wire to a surface of a substrate using heat and ultrasonic energy. The aluminum wire is guided and held by the wire clamp module. When the transducer is triggered, the ultrasonic vibrations of the wedge will transmit to the wire underneath the wedge tip and perform bonding between the wire and the surface of the substrate. After the bonding process, the bonded wire is separated from the bonding tip by the cutter module.

To achieve a good bond, the wire should be well captured under the wedge tip. Good bonding can only be achieved when the bonding wire can be firmly guided to the wedge tip. This is highly dependent on the design and the alignment of the wire clamp which is designed for guiding and holding the bonding wire to the wedge tip. Proper setup of wire clamp is thus needed to achieve good bonding quality.

The heavy wire bonder usually has the capability to bond ribbon wire in addition to round wire as they are compatible and have similar process characteristics. On the other hand, in order to bond ribbon wire, the bond head module needs to be exchanged. The necessity of exchanging the bond head module is due to the different orientations of the respective bonding wires. Lateral placement accuracy is more important for bonding round wire, while placement accuracy of the ribbon wire along the transducer axis is more important for bonding ribbon wire. Consequently, the arrangements of the wire clamps for bonding the different types of wires are different.

FIG. 1 is a schematic configuration of a conventional bond head 100 of a wedge wire bonder used for bonding round wire 102, whereas FIG. 2 is a schematic configuration of a conventional bond head 101 of a wedge wire bonder used for bonding ribbon wire 104. They demonstrate the differences between the conventional round wire bond head 100 and the conventional ribbon bond head 101 respectively.

The schematic figures show the three major components of a bonding tip: a cutter 106, a wedge 108 attached to a transducer and a wire clamp having clamping plates 110. The order and relationship between the three components may vary depending on the applications and designs. The clamping plates 110 of the wire clamp in a conventional round wire bond head 100 will be arranged parallel to a transducer axis 112 as the wire clamp plates function as lateral guides for the round wire 102 in addition to their clamping function.

However, due to the characteristics and generally rectangular cross-section of ribbon wires 104, the design of the clamping plates 110 for round wires cannot conventionally be used for ribbon wire 104. The clamping plates 110 need to clamp onto a wider surface of the ribbon wire 104, or else the wire may be damaged. The clamping plates 110 also guide the position of the ribbon wire 104 with respect to the wedge 108. Thus, it is necessary for the wire clamping plates 110 of the wire clamp to be always perpendicular to the transducer axis 112.

Due to the differences between design requirements of the clamping plates 110, the bond head 100 for bonding round wire 102 and the bond head 101 for bonding ribbon wire 104 are different. Hence, to convert the wire bonding machine between bonding round wire 102 and ribbon wire 104, the whole bond head 100, 101 module of the wire bonding machine needs to be changed.

The requirement of having to replace the bond head in order to bond different types of wire is disadvantageous in that it is time-consuming to install the new bond head. Furthermore, the bonding tool will have to be adjusted and calibrated in order to start using the new bond head.

SUMMARY OF THE INVENTION

It is thus an object of the invention to seek to provide a bonding apparatus which is more easily configurable to bond different types of bonding wires without a need to change the bond head as in the prior art.

Accordingly, the invention provides a wedge wire bonder, comprising: a wedge that is operative to oscillate along a transducer axis for bonding a wire onto a surface; a wire clamp comprising a pair of parallel clamping plates for clamping the wire, the clamping plates having clamping surfaces that are oriented substantially perpendicularly to the transducer axis; and lateral guides arranged on opposite sides of the wire, the lateral guides and the wire being generally aligned parallel to the clamping surfaces of the clamping plates for guiding the wire towards the wedge.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a wire bonding apparatus in accordance with the invention will now be described with reference to the accompanying drawings, in which:

FIG. 1 is a schematic configuration of a conventional bond head of a wedge wire bonder used for bonding round wire;

FIG. 2 is a schematic configuration of a conventional bond head of a wedge wire bonder used for bonding ribbon wire;

FIG. 3 is a schematic configuration of a bond head of a wedge wire bonder according to the preferred embodiment of the invention when it is used to bond round wire;

FIG. 4 is a schematic configuration of the bond head according to FIG. 3 when it is used to bond ribbon wire;

DETAILED DESCRIPTION OF THE PREFERRED EMBODIMENT OF THE INVENTION

Figure 5:
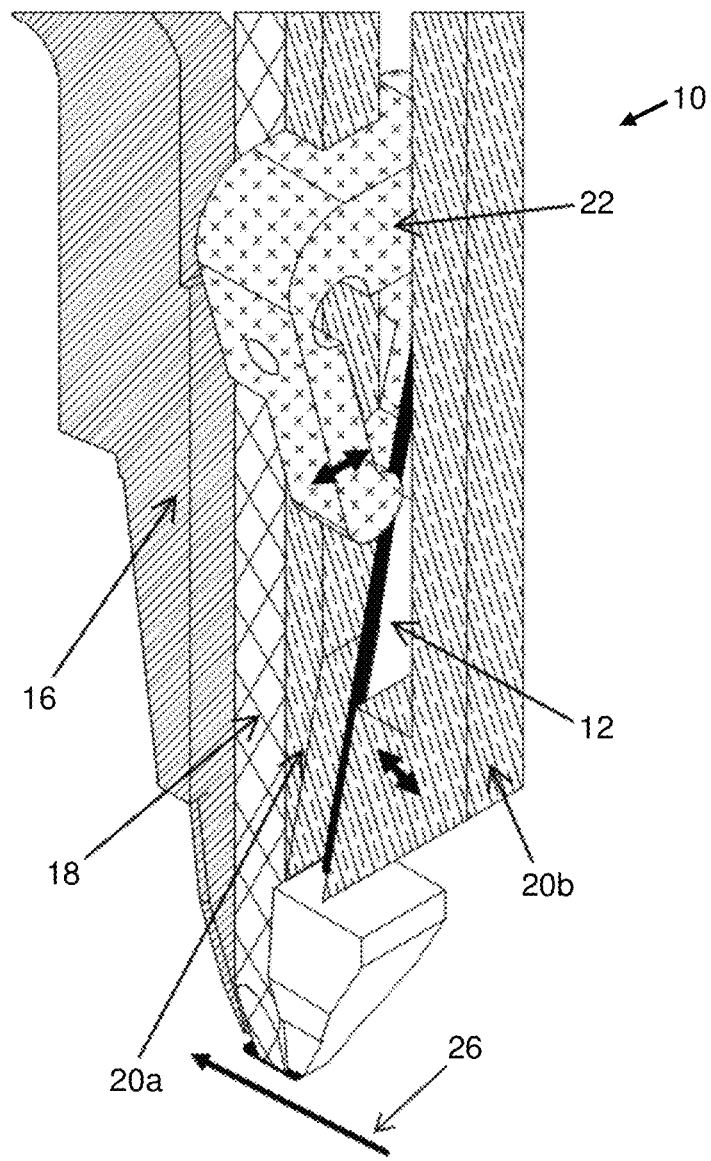
FIG. 5 is an isometric view of the bond head when it is bonding round wire.

FIG. 3 is a schematic configuration of a bond head 10 of a wedge wire bonder according to the preferred embodiment of the invention when it is used to bond round wire 12. Advantageously, the bond head 10 comprises a universal wire clamp design and a wire lateral guiding feature. FIG. 4 is a schematic configuration of the bond head according to FIG. 3 when it is used to bond ribbon wire 14.

The bond head 10 has a universal clamping mechanism comprising a wire clamp with clamping plates 20 which are capable of clamping both round wire 12 and ribbon wire 14 without changing the bond head 10. Accordingly, the bond head 10 is configured to interchangeably receive a round wire 12 (having a round cross-sectional area) and a ribbon wire 14 (having a rectangular cross-sectional area with parallel longer sides and parallel shorter sides) in use.

The design is achieved by the pair of parallel clamping plates 20 being arranged substantially perpendicularly to the transducer axis 24 along which a wedge 18 of the bond head 10 oscillates in operation when bonding a wire 12, 14 to a surface. The clamping plates 20 are further arranged so that their clamping surfaces are parallel to the longer sides of the ribbon wire 14. The wire clamping mechanism is operable to control the feeding of both types of wires 12, 14 with respect to the wedge 18 without any disturbance of their feeding paths.

The universal clamping mechanism also includes lateral guides 22 to guide both types of wires (round wires 12 as well as ribbon wires 14). The lateral guides 22 are arranged on opposite sides of the wire 12, 14, the lateral guides and the wire 12, 14 being generally aligned parallel to the clamping surfaces of the clamping plates 20 for guiding the wire 12, 14 towards the wedge 18. The lateral guides 22 are adjustable to fit different sizes of both types of wires 12, 14.

The universal wire clamp is oriented such that its wire clamping plates 20 are arranged to be perpendicular to the transducer axis 24 of the bond head 10. The design is compatible with ribbon wire 14 since the clamping plates 20 are able to clamp the ribbon wire on its longer sides. Meanwhile, the lateral guides 22 are arranged to contact the shorter sides of the ribbon wire 14 so as to guide the ribbon wire 14. The clamping plates 20 will also guide the ribbon wire 14 with respect to the wedge 18. At the same time, since the round wire 12 does not have any particular requirements as regards the holding direction, the wire clamping plates 20 of the wire clamp may be arranged in the same direction as for clamping ribbon wire 14. The guiding of the wires, especially the round wire 12, in lateral directions is achieved by the lateral guides 22.

Since the lateral guides 22 are used to guide lateral positions of the wires 12, 14, they should include adjustment mechanisms for controlling a distance between guiding surfaces of the lateral guides 22 in directions parallel to the clamping surfaces of the clamping plates 20 so as to fit different types and sizes of wires 12, 14 having different widths and/or diameters. Guiding the wires 12, 14 with the assistance of the lateral guides 22 avoids the need to make the clamping plates 20 always align with the wires' major guiding directions.

Figure 6:
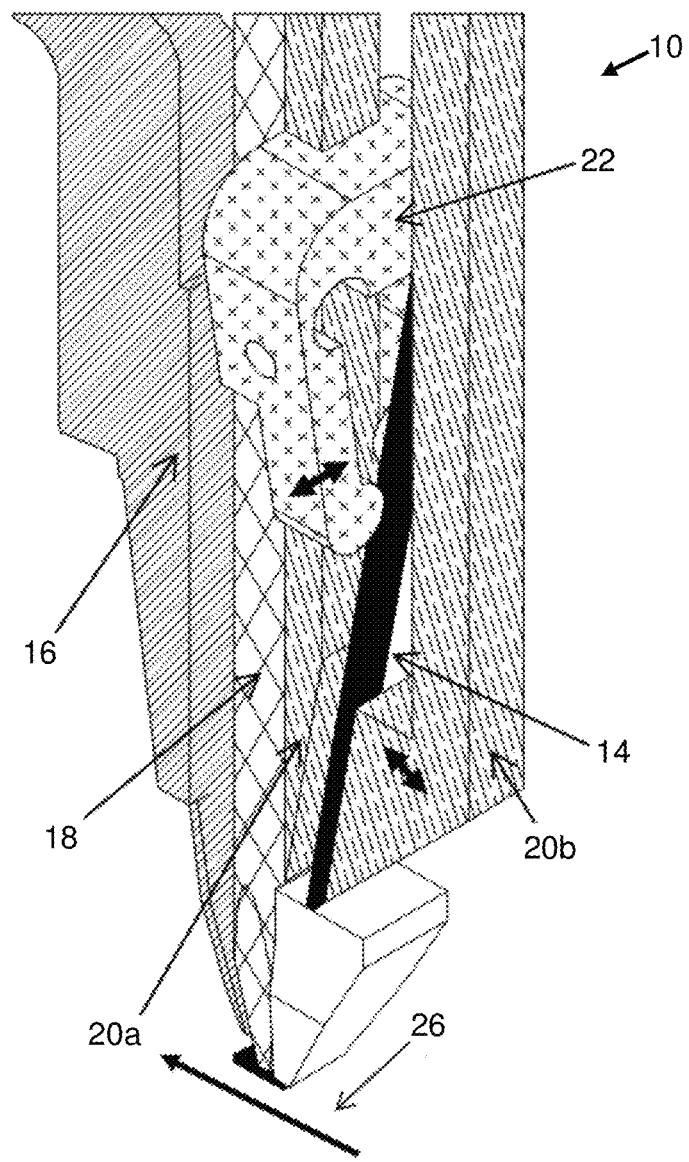
FIG. 6 is an isometric view of the bond head when it is bonding ribbon wire.

FIG. 5 is an isometric view of the bond head 10 when it is bonding round wire 12, whereas FIG. 6 is an isometric view of the bond head 10 when it is bonding ribbon wire 14. As explained above, the bond head 10 has a cutter 16, and a wedge 18 attached to an ultrasonic transducer. The universal wire clamp has a fixed clamping plate 20a and a movable clamping plate 20b that is movable with respect to the fixed clamping plate 20a, the clamping plates 20a, 20b being parallel to each other. The wedge 18 has a wedge vibration axis 26 that is parallel to the transducer axis 24, and the movable clamping plate 20b is configured to move in directions parallel to the transducer axis 24 and wedge vibration axis 26 in order to clamp onto or to release the wire 12, 14.

There are lateral guides 22 mounted on the fixed clamping plate 20a for guiding the bonding wires 12, 14. The lateral guides 22 are adjustable laterally in directions perpendicular to the wedge vibration axis 26 for adapting them to guide different sizes and diameters of wires, especially round wires 12. When a ribbon wire 14 has to be used after using round wire 12, the lateral guides 22 may be adjusted further apart to fit the larger width of the ribbon wire 14. Once the ribbon wire 14 is properly guided by the lateral guides 22, wire bonding operations may commence. Conversely, in order to set up the bond head 10 to bond round wire 12 after bonding ribbon wire 14, the lateral guides 22 may be adjusted closer together to fit a smaller diameter of the round wire 12 accordingly.

It should be appreciated that the bond head 10 according to the preferred embodiment ensures that the same bond head 10 can hold and guide different types of wire 12, 14 without a need to re-align the wire clamp orientation with a wire's major guiding direction. Thus, no major exchange of a mechanical structure is required. When changing bonding wire from ribbon wire 14 to round wire 12 or vice versa, users only need to make corresponding adjustments to the lateral guides 22. Hence, no replacement of bond heads 10 is needed.

Accordingly, the bond head 10 according to the preferred embodiment of the invention will expand the bonding capability of the heavy wire bonder interchangeably from round wire 12 to ribbon wire 14 utilizing a single bond head module. It will improve the efficiency of the wire bonding machine by avoiding additional conversion time for exchanging the bond head and hence, increases the efficiency of the wire bonding machine.

The invention described herein is susceptible to variations, modifications and/or additions other than those specifically described and it is to be understood that the invention includes all such variations, modifications and/or additions which fall within the spirit and scope of the above description.

The invention claimed is:
1. A wedge wire bonder, comprising:
a wedge that is operative to oscillate along a transducer axis so as to bond a wire onto a surface;
a wire clamp comprising a pair of parallel clamping plates positioned and configured to clamp the wire, the clamping plates having clamping surfaces that are oriented substantially perpendicularly to the transducer axis; and
first and second lateral wire guides arranged spaced from the wire clamp,
wherein the first and second lateral wire guides comprise guiding surfaces that are oriented substantially perpendicular to the clamping surfaces of the wire clamp and are adjustable relative to each other so as to change a distance between the guiding surfaces of the first and second lateral wire guides, the first and second lateral wire guides being generally aligned parallel to the clamping surfaces of the clamping plates, and the guiding surfaces of the first and second lateral wire guides being configured to contact and guide the wire towards the wedge.

2. The wedge wire bonder as claimed in claim 1, wherein the change in the distance between the first and second lateral wire guides configures the wedge wire bonder to interchangeably receive a wire with a round cross-sectional area and a wire with a rectangular cross-sectional area in use.

3. The wedge wire bonder as claimed in claim 2, wherein the wire with a rectangular cross-sectional area has parallel longer sides and parallel shorter sides, and the clamping surfaces of the clamping plates are arranged to clamp the parallel longer sides of the wire and the lateral wire guides are arranged to contact and guide the parallel shorter sides of the wire.

4. The wedge wire bonder as claimed in claim 1, wherein the lateral wire guides are adjustable to control a distance between the guiding surfaces of the lateral wire guides so as to fit different sizes of wires between the lateral wire guides.

5. The wedge wire bonder as claimed in claim 1, wherein the wire clamp is operative to control feeding of the wire with respect to the wedge.

6. The wedge wire bonder as claimed in claim 1, wherein the clamping plates comprise a fixed clamping plate and a movable clamping plate that is movable with respect to the fixed clamping plate.

7. The wedge wire bonder as claimed in claim 6, wherein the movable clamping plate is configured to move in directions parallel to the transducer axis in order to clamp onto or release the wire.

8. The wedge wire bonder as claimed in claim 6, wherein the lateral wire guides are mounted onto the fixed clamping plate.

* * * * *